United States Patent
Bracco

(10) Patent No.: US 9,608,597 B2
(45) Date of Patent: Mar. 28, 2017

(54) DIGITAL INTERPOLATOR AND METHOD OF INTERPOLATING

(71) Applicant: The Swatch Group Research and Development Ltd., Marin (CH)

(72) Inventor: Massimiliano Bracco, Le Landeron (CH)

(73) Assignee: The Swatch Group Research and Development Ltd, Marin (CH)

( * ) Notice: Subject to any disclaimer, the term of this patent is extended or adjusted under 35 U.S.C. 154(b) by 104 days.

(21) Appl. No.: 14/788,874

(22) Filed: Jul. 1, 2015

(65) Prior Publication Data
US 2016/0013772 A1 Jan. 14, 2016

(30) Foreign Application Priority Data
Jul. 11, 2014 (EP) .................................... 14176797

(51) Int. Cl.
| | | |
|---|---|---|
| *H03B 19/00* | (2006.01) | |
| *H03H 11/20* | (2006.01) | |
| *H03H 17/06* | (2006.01) | |
| *H03L 7/16* | (2006.01) | |
| *H03H 17/04* | (2006.01) | |
| *H03B 21/00* | (2006.01) | |

(52) U.S. Cl.
CPC ........ *H03H 11/20* (2013.01); *H03H 17/0444* (2013.01); *H03B 19/00* (2013.01); *H03B 21/00* (2013.01); *H03H 17/04* (2013.01); *H03H 17/06* (2013.01); *H03H 17/0671* (2013.01); *H03L 7/16* (2013.01)

(58) Field of Classification Search
None
See application file for complete search history.

(56) References Cited

U.S. PATENT DOCUMENTS

| | | | | |
|---|---|---|---|---|
| 4,999,798 A | * | 3/1991 | McCaslin | H03H 17/0671 |
| | | | | 708/313 |
| 5,835,390 A | | 11/1998 | Trager | |
| 5,880,687 A | * | 3/1999 | May | H04L 27/0002 |
| | | | | 341/61 |
| 6,584,162 B1 | | 6/2003 | Tinker | |
| 9,319,058 B1 | * | 4/2016 | Yu | H03M 1/1038 |
| 2003/0067405 A1 | * | 4/2003 | Keaveney | G06F 17/17 |
| | | | | 341/143 |
| 2006/0244644 A1 | * | 11/2006 | Zoso | H03H 17/0621 |
| | | | | 341/143 |

(Continued)

FOREIGN PATENT DOCUMENTS

EP        0 658 979 A2    6/1995

OTHER PUBLICATIONS

European Search Report for EP Application No. 14 17 6797 dated Dec. 23, 2014.

*Primary Examiner* — Tuan T Lam
(74) *Attorney, Agent, or Firm* — Sughrue Mion, PLLC

(57) ABSTRACT

The present invention relates to a digital interpolator, comprising an input to receive an input signal at a first clock frequency and comprising an output to provide an interpolated signal at a second clock frequency larger than the first clock frequency. The interpolator comprises a differentiator connected to the input, an interpolator stage connected to a differentiator output, and an integrator connected to the output and connected to an output of the interpolator stage.

13 Claims, 3 Drawing Sheets

(56) References Cited

U.S. PATENT DOCUMENTS

2010/0135368 A1 6/2010 Mehta et al.
2016/0094240 A1* 3/2016 O'Shaughnessy . H03H 17/0664
    341/123

* cited by examiner

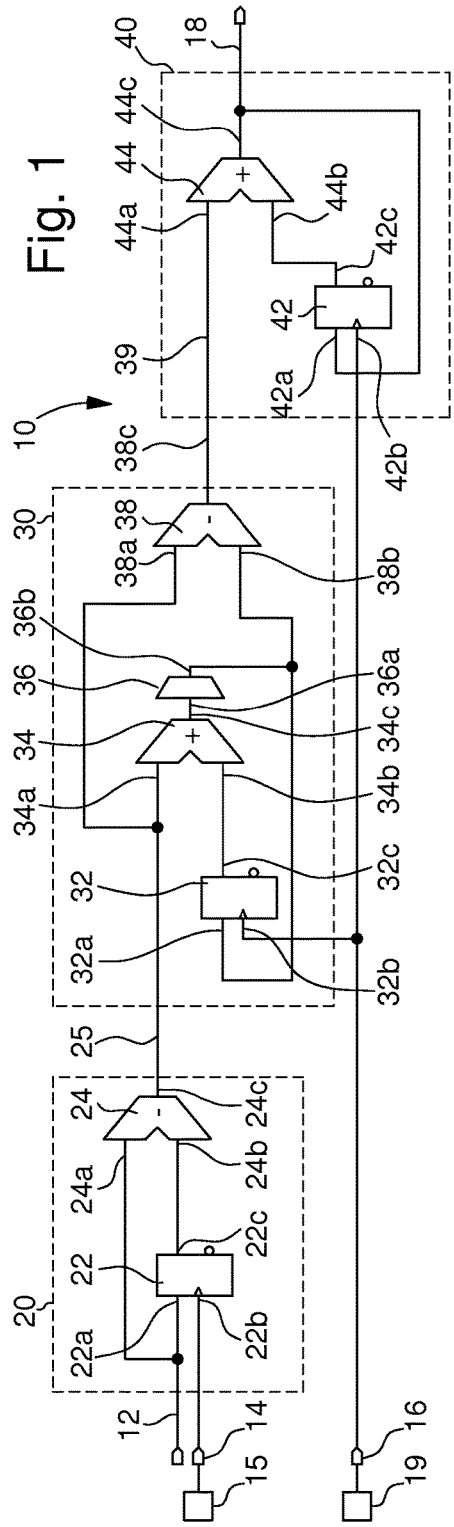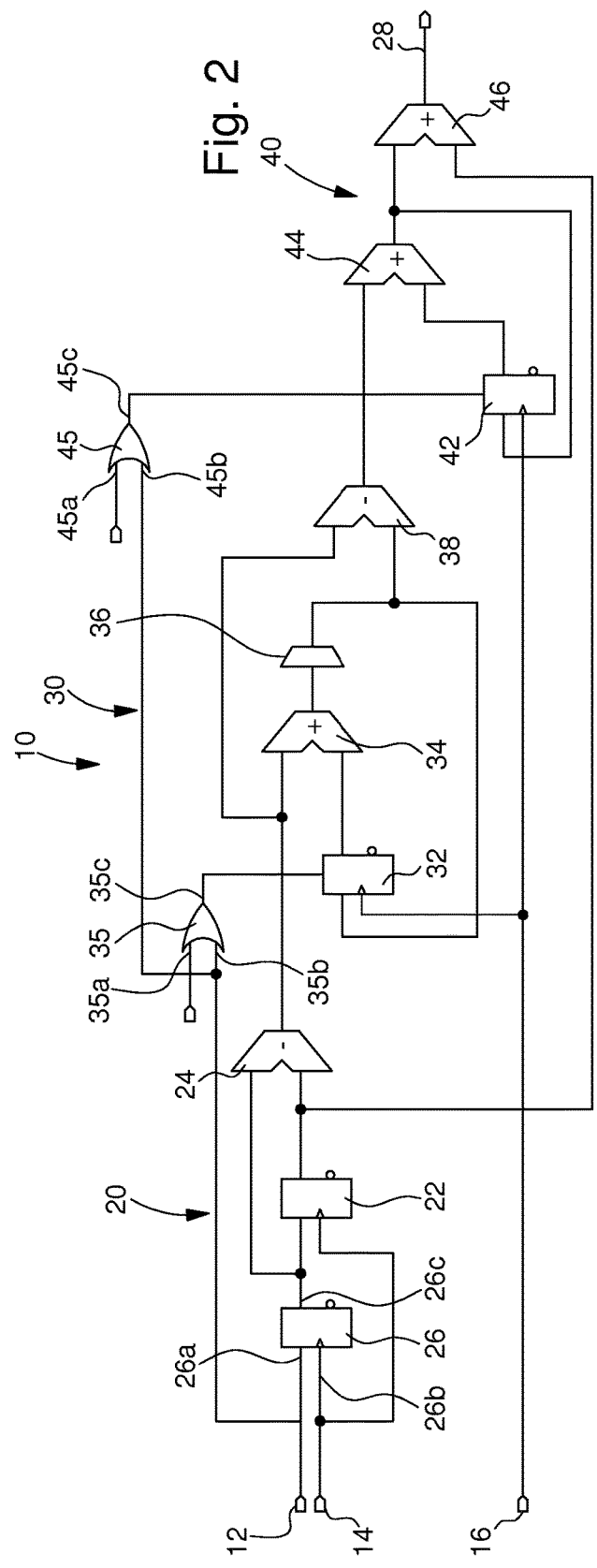

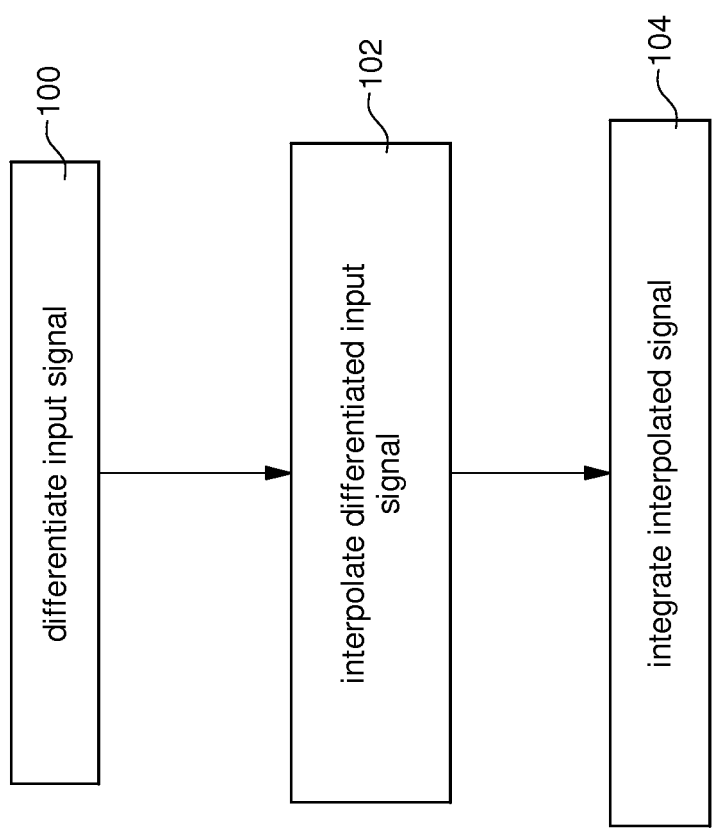

DIGITAL INTERPOLATOR AND METHOD OF INTERPOLATING

This application claims priority from European patent application No. 14176797.0 filed Jul. 11, 2014, the entire disclosure of which is hereby incorporated herein by reference.

FIELD OF THE INVENTION

The present invention relates to a digital interpolator and to a respective method of interpolating a sequence of digital signals at a first clock frequency to a sequence of signals at a second clock frequency larger than the first clock frequency.

BACKGROUND AND PRIOR ART

For efficient data storage it is advantageous to reduce the amount of data in the storage and to reproduce a series or sequence of signals from only two consecutively stored signals or storage values. In this way, storage space can be saved and/or data to be stored can be compressed. For specific applications, for instance with wearable or mobile electronic devices, such like mobile phones or wrist watches there might be a demand for storing data representing sound or music at a comparatively low sampling rate. When reading the data from the memory and for reproducing the sound or music from the stored data a hardware implemented interpolation of the stored signals is generally required.

There exists solutions for digital interpolators that make use of a cascade of finite response filters (FIR), e.g. in order to implement an interpolation from 32 kHz to 256 kHz. Such a cascade of FIR filters requires a comparatively large amount of gates or memory blocks, which in turn may cover a major portion of the area of a respective integrated circuit (IC).

An interpolation filter is also known in view of the patent application EP 0 658 979 A2 and the patent U.S. Pat. No. 5,835,390.

The patent application US 2010/0135368 A1 describes an apparatus able to perform an interpolation of an input sample stream. For that the interpolating mechanism comprises an up-sampler structure, which includes a linear interpolator. The up-sampler circuit comprises a differentiator, a linear interpolator and an integrator for providing an output interpolated signal having a frequency greater than the frequency of the input signal.

SUMMARY OF THE INVENTION

It is therefore an object of the present invention to provide an improved digital interpolator, wherein the hardware of the interpolator requires less space on an integrated circuit. In addition, the digital interpolator should exhibit a rather simple structure in terms of its number and arrangement of gates or memory blocks in order to save space on the integrated circuit. At the same time, the digital interpolator should provide good or excellent interpolation results and should run stable even on a long-term scale.

In a first aspect the invention relates to a digital interpolator comprising an input to receive an input signal at a first clock frequency. The digital interpolator further comprises an output to provide an interpolated signal at a second clock frequency, wherein the second clock frequency is larger than the first clock frequency. The interpolator comprises a differentiator that is connected to the input. The interpolator further comprises an interpolator stage connected to a differentiator output and further comprises an integrator connected to the output and connected to an interpolator output.

Hence, the digital interpolator comprises three stages or components, namely a differentiator stage, denoted as differentiator, an interpolator stage and an integrator or integrator stage. The three components or stages are arranged in series or as a cascade of stages. The input of the digital interpolator is provided by an input of the differentiator. An output of the differentiator is connected to an input of the interpolator stage and the output of the interpolator stage is connected to an input of the integrator, while the output of the integrator forms the output of the digital interpolator. As will be explained below, the series or cascade of differentiator, interpolator stage and integrator provides a space-saving approach to a digital interpolator, which is less spacious compared to a cascade of a number of FIR. Also the total number of memory blocks or memory cells on the IC can be reduced. At the same time, the overall architecture of the digital interpolator can be simplified. In effect, the digital interpolator comprised of differentiator, interpolator stage and integrator is rather robust and serves to provide interpolated signals of sufficient or even excellent quality.

According to an embodiment the digital interpolator comprises a first clock operated on the first clock frequency and further comprises a second clock operated on the second clock frequency. As already mentioned, the second clock frequency is larger than the first clock frequency. In a further embodiment the second clock frequency is an integer multiple of the first clock frequency. The digital interpolator, hence the sequence or cascade of differentiator, interpolator stage and integrator serves to provide a signal for each clock signal of the second clock frequency on the basis of consecutive signals of the first clock frequency. For example, the second clock frequency is eight times larger than the first clock frequency. In this way compressed data stored in a memory and subject to a read operation on the basis of the first clock frequency is transferable into an interpolated signal on the basis of the second clock frequency.

According to another embodiment the differentiator is operated on the first clock frequency while the interpolator stage and the integrator are operated on the second clock frequency. By means of the differentiator, the signals to be interpolated are initially differentiated. Hence, a first derivative of the sequence of data signals is derived and obtained. The interpolation carried out by the interpolator stage is then performed and conducted on the basis of a differentiated signal sequence. The integrator at the end re-transforms the interpolated signal into data signals but at a larger second clock frequency compared to the first clock frequency at which data readout is conducted.

In this way, the overall architecture of the digital interpolator can be simplified without any substantial detrimental effects in regard to signal quality compared to conventional solutions that might be based on a cascade of FIR stages.

According to a further embodiment the differentiator comprises a storage that is driven or operated by the first clock frequency and further comprises a subtractor to calculate the difference between the input signal at a first clock time of the first clock and between the input signal at a following clock time of the first clock. Typically, the storage effectively acts as a shift register. It stores an input signal at a first clock time of the first clock and forwards the stored signal to the differentiator at the following clock time of the first clock.

While forwarding the first input signal to the differentiator at or during the following clock time, the signal provided and coinciding with the following clock time of the first clock is stored by the storage. During a further, hence during a next consecutive clock time, the signal stored by or during the second clock time is forwarded to the differentiator and so on. Hence, the storage provides and forwards the input signal to the differentiator that corresponds to the previous clock time while the differentiator's subtractor is connected to both, the output of the storage of the differentiator and to the overall input of the digital interpolator, hence to the input of the differentiator. The subtractor is then operable to calculate the difference between the input signal at a first clock time and the input signal at a second or consecutive clock time. Hence, the output of the subtractor is always indicative of the change and the difference between consecutive input signals that are provided at the first clock frequency.

According to another embodiment the interpolator stage comprises a storage, an adder, a divider and a subtractor. There, an output of the adder is connected to a divider's input. A divider's output is connected to a storage input. A storage output is connected to an input of the adder and a further input of the adder is connected to the output of the differentiator. In other words, the interpolator stage comprises a loop consisting of the adder, the divider and the storage.

Here, one input of the subtractor is connected to the input of the interpolator stage. It is hence parallel to the adder while a second input of the subtractor is connected with the output of the divider. This particular arrangement of storage, adder, divider and subtractor allows to calculate a series of signals that are located between the output of the differentiator at a first clock time and the output of the differentiator at a following or second clock time. The interpolator stage as implemented by the arrangement of storage, adder, divider and subtractor provides a particular interpolation function, which is rather beneficial and effective to calculate a series of signal values on the basis of the second clock frequency that continuously approach values of consecutive signals provided on the basis of the first clock frequency.

By means of the loop of storage, adder and divider, a signal initially provided e.g. at the first clock time of the first clock frequency can be added with a signal previously stored by the storage. The addition of the two signals is divided by the divider and the divided signal is stored in the memory, which comparable to the storage of the differentiator, may act as a kind of a shift register. In comparison to the differentiator, the interpolator stage is operated on the second clock signal. Hence, the time interval between consecutive operations of the interpolator stage is shorter than the time interval between two consecutive signals provided at the first clock frequency.

Assuming that the output of the differentiator is $0$ at the first clock time of the first clock and that the output equals $1$ at the consecutive clock time of the first clock, the interpolator stage is operable to calculate a sequence of signals in between these consecutive output signals. Assuming that the divider of the interpolator stage constantly provides a division by the factor 2, the loop of adder, divider and storage is operable to generate a sequence of the following values: $1/2$, $3/4$, $7/8$, $15/16$, $31/32$, and so on.

According to a further embodiment the divider of the interpolator stage divides the output of the adder by a constant factor. The output of the divider is connected to the input of the interpolator stage's storage. The storage of the interpolator stage is driven by the second clock frequency.

The input of the storage provided at a first clock time of the second clock is then provided to the input of the adder at a following or consecutive clock time of the second clock. Hence, one input of the interpolator stage's adder is connected to an output of the interpolator stage's storage while the other input of the adder is connected to the output of the differentiator, in particular it is connected to the output of the subtractor of the differentiator.

According to a further embodiment the divider of the interpolator stage divides the output of the adder by a constant factor before the divided output of the adder is stored by the interpolator stage's storage.

According to another embodiment the subtractor of the interpolator stage has a first input connected to the differentiator output and further has a second input connected to the output of the divider. In this way the subtractor of the interpolator stage serves to provide a sequence of signals on the basis of the second clock frequency.

Assuming an input signal of the interpolator stage jumping from 0 to 1 and further assuming that the divider is constantly dividing the output of the adder by a factor of 2, the output sequence of the subtractor reads as: $1/2$, $1/4$, $1/8$, $1/16$, $1/32$ and so on. In this way, a series of signals can be generated, wherein the difference between consecutive signals constantly decreases. In this way, a much more effective interpolation scheme compared to a linear interpolation can be provided.

According to a further embodiment an output of the interpolator stage's subtractor is connected to the integrator of the digital interpolator. Hence, a series of signals as mentioned above is integratable by means of the integrator. Moreover, by way of the integrator, the initial derivative provided by the differentiator can be compensated and the signal output of the digital interpolator is then in the same domain compared to its initial input.

According to another embodiment the integrator comprises a storage and an adder. One input of the adder is connected to the integrator's storage while the further input of the adder is connected to the interpolator stage's output. Also the integrator is driven by the second clock signal. In this way, a sequence of interpolated signals is generatable.

In another embodiment the interpolator's storage and the integrator's storage are operated on the second clock frequency. In this way, the interpolator stage and the integrator are effectively clocked by the second clock frequency and respective clock signals.

According to a further embodiment at least one of the interpolator's storage and the integrator's storage is resettable by the first clock, hence by the first clock signal. In this way, the interpolator can be reset at the beginning of an interpolation operation. A potential drifting of the output of the digital interpolator can be prevented in this way.

In still another embodiment at least one of the storage of the interpolator stage and the storage of the integrator is connected with an output of an OR-gate having an input connected to the first clock. In this way, the storage of at least one of the interpolator stage or the integrator is reset at regular time intervals that correspond to the time interval between consecutive signals of the first clock. Also in this way, a drift of output signals of the digital interpolator can be prevented and counteracted.

Typically, both, the storage of the interpolator stage and the storage of the integrator are each connected via a separate OR-gate with the first clock.

According to another aspect the invention also relates to an electronic device comprising at least one digital interpolator as described above. The electronic device may be implemented as a mobile or wearable device. It may comprise an electronic watch or a mobile phone.

In a further aspect the invention also relates to a method of interpolating an input signal provided on the basis of a first clock frequency to a series of signals on the basis of a second clock frequency, wherein the second clock frequency is larger than the first clock frequency. The method comprises the steps of differentiating the input signal provided on the first clock frequency, interpolating a sequence of consecutive differentiated signals and integrating the sequence of interpolated signals.

In particular, the method is implemented and conducted by the digital interpolator as described above. Consequently, the invention as described in connection with the digital interpolator equally applies to the method of interpolating and vice versa. In particular, any features, benefits and characteristics described in connection to the digital interpolator equally apply to the method of interpolating; and vice versa.

BRIEF DESCRIPTION OF THE DRAWINGS

In the following, an embodiment of the invention will be described by making reference to the drawings, in which:

FIG. 1 schematically shows a circuit diagram of the digital interpolator,

FIG. 2 shows a further representation of the digital interpolator,

FIG. 5 is a flowchart of a respective method of interpolating.

DETAILED DESCRIPTION

Figure 3:
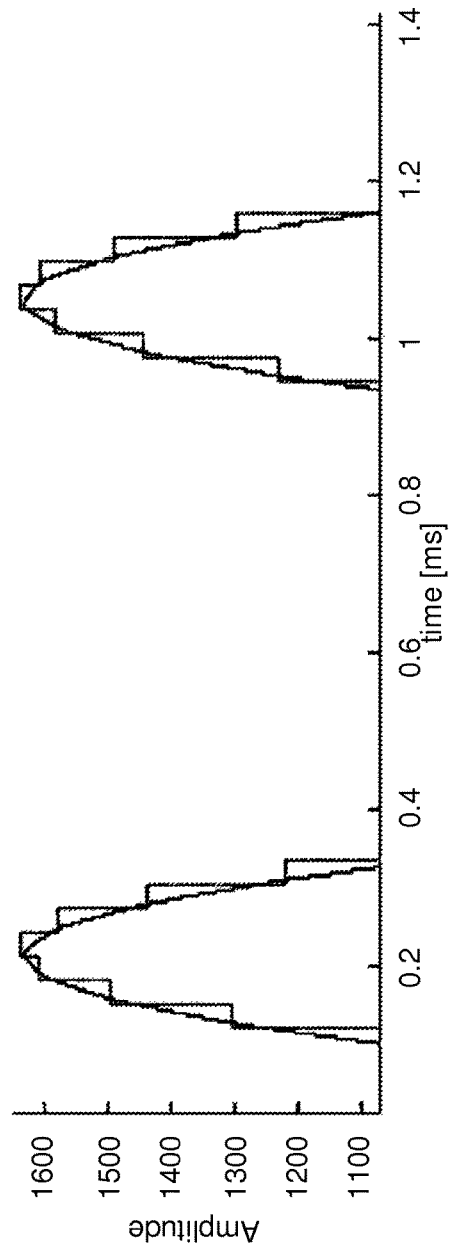
FIG. 3 shows an output and an input signal of the digital interpolator.

In FIG. 1, the digital interpolator 10 is illustrated in a block diagram. The digital interpolator comprises an input 12 to receive and to process an input signal 50 and further comprises an output 18 to provide an interpolated output signal 52. The digital interpolator 10 further comprises a first clock input 14 and a second clock input 16. The input signal 50 is provided on the basis of the first clock signal driven by a first clock frequency f1 while the output 18 is driven by a second clock signal, i.e. by a second clock frequency f2, which is larger than the first clock frequency f1.

The digital interpolator 10 comprises a differentiator 20, an interpolator stage 30 as well as an integrator 40. Differentiator 20, interpolator stage 30 and integrator 40 are mutually connected to form a cascade. The output of the differentiator 20 is connected to an input of the interpolator stage 30 while an output of the interpolator stage is connected to an input of the integrator 40. The output of the integrator 40 forms or corresponds to the output 18 of the digital interpolator 10. The input 12 of the digital interpolator 10 is equal to or is connected to the input of the differentiator 20.

The first clock input 14 is connected to a first clock 15 operating at a first clock frequency f1. The second clock input 16 is connected to a second clock 19 driven by a second clock frequency f2, which is larger than the first clock frequency f1.

Typically, the second clock frequency f2 is a multiple integer of the first clock frequency f1.

The differentiator 20 comprises a storage 22 driven by the first clock 15 and further comprises a subtractor 24. The subtractor 24 comprises a first input 24a and a second input 24b. The first input 24a is connected to the input 12 while the second input 24b is connected to an output 22c of the storage 22. A first input 22a of the storage 22 is also connected to the input 12. A second input 22b of the storage 22 is connected to the first clock 15 via the clock input 14. In this way, the storage 22 acts and behaves like a shift register. It is operable to store one signal value and to output the stored signal value at a proceeding clock signal. In this way, one input 24a of the subtractor 24 of the differentiator 20 is connected to the input 12 while the other input 24b is connected to the output 22c of the storage 22. In this way, the subtractor 24 is supplied with the signal input at a time T and with an input at a time T-1.

The subtractor 24 therefore compares and subtracts consecutive signals that are present to the differentiator 20 at subsequent clock times of the first clock 15.

The output 24c of the subtractor 24 forms an output 25 of the differentiator 20 which is connected to the interpolator stage 30.

The interpolator stage 30 comprises another storage 32, an adder 34, a divider 36 as well as a subtractor 38. As illustrated in FIGS. 1 and 2, the interpolator stage 30 comprises and forms an interpolator stage output 39 that is connected to the integrator 40, in particular to an input of the integrator 40. The storage 32 of the interpolator stage 30 comprises a first input 32a that is connected with an output 36b of the divider 36.

An input 36a of the divider 36 is connected to an output 34c of the adder 34. A second input 34b of the adder 34 is connected to an output 32c of the storage 32. In this way, storage 32, adder 34 and divider 36 form a closed loop. The storage 32 further comprises a second input 32b that is connected to the second clock 19. Hence, the storage 32 of the interpolator stage 30 is driven by the second clock 19 and operates therefore faster than the differentiator 20. A first input 34a of the adder 34 of the interpolator stage 30 is connected to the output 25 of the differentiator 20 and hence it is connected to the output 24c of the differentiator's 20 subtractor 24.

The loop 32, 34, 36 of the interpolator stage 30 serves to generate a sequence of signals, such like ½, ¾, ⅞, ¹⁵⁄₁₆, and so on given that the input signal 50 jumps from 0 to 1 and two consecutive signals are operated and driven by the first clock.

The interpolator stage 30 further comprises a subtractor 38 having a first input 38a and a second input 38b as well as an output 38c that forms an output 39 of the interpolator stage 30. The input 38a of the subtractor 38 is directly connected to the output 25 of the differentiator 20. The further input 38b of the subtractor 38 is connected to the output 36b of the divider 36. In this way, a sequence of signals as described and mentioned above is transferred into a sequence, such like: ½, ¼, ⅛, ¹⁄₁₆, ¹⁄₃₂, and so on.

The integrator 40 comprises another adder 44 and a storage 42. A first input of the storage 42a is connected to an output 44c of the adder 44 while another input 42b of the storage 42 is also connected to the second clock 19. An input 44a of the adder 44 is connected to the output 39 of the interpolator stage 30. A further input 44b of the adder 44 is connected to the output 42c of the storage 42. As it becomes apparent from FIG. 1, the adder 44 and the storage 42 of the integrator 40 are arranged in a closed loop so that consecutive signals obtained at the input 44a of the adder 44 accumulate. So when the input signal 50 for instance jumps from 0 to 1 between consecutive signals t and t+1 of the first clock 15 the integrator 40 quickly delivers intermediate values, that quickly approach the target value of the input signal present at a clock time t+1.

In FIG. 2 the digital interpolator 10 according to FIG. 1 is shown in more detail. There, identical or similar components are denoted with identical or similar reference numbers. In addition, there are shown two OR-gates 35, 45. The OR-gate 35 comprises an output 35c that is connected to a reset input of the storage 32 of the interpolator stage 30. One input 35a of this OR-gate 35 is connected to a reset switch, which is not particularly shown while the other input 35b is connected to the first clock 15 or to the first clock input 14.

In a similar way, also the first input 45a of the OR-gate 45 of the integrator 40 is connected to a reset switch while a second input 45b of the OR-gate 45 is connected to the first clock 15 or to the first clock input 14. Also there, the output 45c of the OR-gate is connected to a reset input of the storage 42 of the integrator 40. In this way the storages 32, 42 are subject to repeated reset every time the first clock 15 proceeds one step further. In this way, a drift of the output signal as well as offset effects upon a startup of the digital interpolator 10 can be compensated or eliminated.

In addition and in comparison to FIG. 1, FIG. 2 further shows another storage 26 of the differentiator 20. An output 26c of this additional storage 26 is connected to the input 22a of the storage 22. An input 26a of this additional storage 26 is connected to the input 12 of the digital interpolator 10. Hence another input 26b is also connected to the first clock 15 or to the first clock input 14. In this way, the further input 26 acts as a buffer for the storage 22 and hence for the differentiator 20.

Furthermore in FIG. 2, there is another or second adder 46 in the integrator 40 after the first adder 44. A first input of the second adder 46 is connected to the output of the first adder 44, and a second input of the second adder 46 is connected to the second input of the subtractor 24 of the differentiator 20. The output of the second adder 46 provides an interpolated output signal 28, which is the output of the integrator 40 of the digital interpolator 10.

It is to be noted that the second adder 46 takes the starting data value from the differentiator 20 to add the result of the interpolation. At every reset, the interpolation result is zero and the second adder simply gives the starting data at its output 28.

In FIG. 3, an input signal 50 provided on the basis of the first clock frequency f1 is shown together with the output signal 52 of the digital interpolator 10 that is provided on the basis of the second clock frequency f2. As illustrated in FIG. 3, the input signal 50 is rather course while the output signal 52 represents a rather smooth interpolation of the consecutive signal values of the input signal 50.

Figure 4:
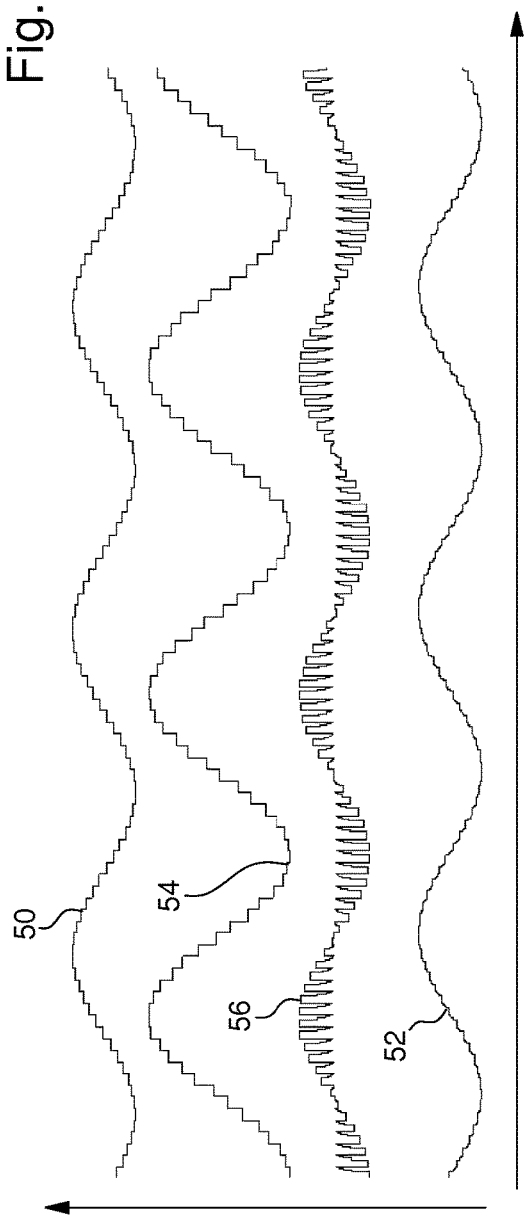
FIG. 4 shows various signals of the digital interpolator at its input, its output as well as at the output or input of its components, namely differentiator, interpolator stage and/or integrator.

In FIG. 4 amplitude versus time of the input signal 50 and the output signal 52 is illustrated. In addition, FIG. 4 shows the output of the differentiator 20 and hence a differentiated input signal 54. FIG. 4 is further indicative of the output of the interpolator stage 30 and exemplary illustrates the interpolator stage output signal 56. A comparison of input signal 50 and output signal 52 reveals a smoothening of the input signal 50.

It is finally to be noted, that the divider 36 of the interpolator stage 30 is presently described as a divider operating with a divider that equals 2. However, there are many other implementations conceivable, with different dividers 36, by way of which different interpolation schemes could be easily realized.

FIG. 5 further represents a flowchart of the method of interpolating as it is conducted and operated by the digital interpolator 10. In a first step 100 an input signal is differentiated. In a consecutive second step 102, the differentiated signal or derived signal 54 is interpolated to form an interpolator stage output signal 56. In a further step 104, the interpolated and differentiated signal 56 is integrated by means of the integrator 40 to form the output signal 52 at a second clock frequency f2, which is larger than the clock frequency f1 on which the input signal 50 is initially provided.

What is claimed is:

1. A digital interpolator, comprising an input to receive an input signal at a first clock frequency and comprising an output to provide an interpolated signal at a second clock frequency larger than the first clock frequency, the interpolator comprising:
   a differentiator connected to the input,
   an interpolator stage connected to a differentiator output, and
   an integrator connected to the output and connected to an output of the interpolator stage,
   wherein the interpolator stage comprises a storage, an adder, a divider and a subtractor wherein an output of the adder is connected to a divider's input, wherein a divider's output is connected to a storage input and wherein a storage output is connected to an input of the adder, wherein a first input of the subtractor is connected to the differentiator output and a second input of the subtractor is connected to the divider's output, and wherein a further input of the adder is connected to the differentiator output.

2. The digital interpolator according to claim 1, further comprising a first clock operated on the first clock frequency and comprising a second clock operated on the second clock frequency.

3. The digital interpolator according to claim 1, wherein the second clock frequency is an integer multiple of the first clock frequency.

4. The digital interpolator according to claim 1, wherein the differentiator is operated on the first clock frequency and wherein the interpolator stage and the integrator are operated on the second clock frequency.

5. The digital interpolator according to claim 1, wherein the differentiator comprises a storage driven by the first clock frequency and a subtractor to calculate the difference between the input signal at a first clock time of the first clock and the input signal at a following clock time of the first clock.

6. The digital interpolator according to claim 1, wherein the divider divides the output of the adder by a constant factor.

7. The digital interpolator according to claim 1, wherein an output of the interpolator stage's subtractor is connected to the integrator.

8. The digital interpolator according to claim 1, wherein the integrator comprises a storage and an adder, wherein one input of the adder is connected to the integrator's storage and wherein a further input of the adder is connected to the interpolator stage's output.

9. The digital interpolator according to claim 1, wherein the interpolator stage's storage and an integrator's storage are operated on the second clock frequency.

10. The digital interpolator according to claim 2, wherein at least one of the interpolator stage's storage and the integrator's storage is resettable by the first clock.

11. The digital interpolator according to claim 10, wherein at least one of the interpolator stage's storage and the integrator's storage is connected with an output of an OR-gate having an input connected to the first clock.

12. An electronic device comprising at least one digital interpolator according to claim 1.

13. A method of interpolating a digital input signal of first clock frequency to an output signal of a second clock frequency, wherein the method comprises the steps of:
   differentiating a digital sequence of the input signal,
   interpolating the differentiated sequence in an interpolator stage, which comprises a storage, an adder, a divider and a subtractor wherein an output of the adder is connected to a divider's input, wherein a divider's output is connected to a storage input and wherein a storage output is connected to an input of the adder, wherein a first input of the subtractor is connected to the differentiator output and a second input of the subtractor is connected to the divider's output, and wherein a further input of the adder is connected to the differentiator output, and
   integrating the interpolated signal from the interpolator stage.

\* \* \* \* \*